United States Patent [19]
Schmidt et al.

[11] Patent Number: 5,925,904
[45] Date of Patent: Jul. 20, 1999

[54] TWO-TERMINAL ELECTRICALLY-REPROGRAMMABLE PROGRAMMABLE LOGIC ELEMENT

[75] Inventors: Dominik Schmidt, San Jose; Raminda Madurawe, Sunnyvale, both of Calif.

[73] Assignee: Altera Corporation, San Jose, Calif.

[21] Appl. No.: 08/827,328

[22] Filed: Mar. 26, 1997

Related U.S. Application Data

[XX .
[60] Provisional application No. 60/014,560, Apr. 3, 1996.
[51] Int. Cl.⁶ .................... H01L 27/108; H01L 29/76; H01L 29/94; H01L 31/119
[52] U.S. Cl. .................... 257/296; 257/298; 257/300; 257/315; 257/316
[58] Field of Search .................................. 257/296, 298, 257/300, 315, 316

[56] References Cited

U.S. PATENT DOCUMENTS

| | | | |
|---|---|---|---|
| 5,172,196 | 12/1992 | Matsukawa et al. | 257/316 |
| 5,495,116 | 2/1996 | Funakoshi et al. | 257/239 |
| 5,544,103 | 8/1996 | Lambertson | 365/185.15 |
| 5,721,440 | 2/1998 | Kowalski | 257/300 |

FOREIGN PATENT DOCUMENTS

| | | | |
|---|---|---|---|
| 2-133967 | 5/1990 | Japan | 257/300 |
| WO 94/22142 | 9/1994 | WIPO . | |

OTHER PUBLICATIONS

Yosuke Mochizuki, "Non–Volatile, and High Density Rewritable FPGA Developed Logic Change Becomes Possible on Board: Cell of a Flash Memory is Used as a Switch," *Nikkei Micro devices*, Jul. 1995, at 262.

*Primary Examiner*—William Mintel
*Attorney, Agent, or Firm*—Fish & Neave; G. Victor Treyz; Brett G. Alten

[57] ABSTRACT

A non-volatile two terminal programmable logic element and associated methods for charging and discharging are disclosed. The logic element includes one input and one output terminal, a first capacitor region, a second capacitor region, and a floating gate (transistor-type) structure. The first capacitor region does not permit tunneling. The second capacitor region permits tunneling between its respective electrodes when a predetermined voltage, substantially higher than the normal operating voltage is applied. The source is connected to the input terminal and one electrode of the first capacitor region. The drain is connected to the output terminal and one electrode of the second capacitor region. The floating gate is connected to the other electrodes of the first and second capacitor regions. A programmable logic device constructed from these elements and associated methods of programming and erasing such a device are also shown.

28 Claims, 4 Drawing Sheets

TWO-TERMINAL ELECTRICALLY-REPROGRAMMABLE PROGRAMMABLE LOGIC ELEMENT

CROSS REFERENCE TO RELATED APPLICATION

This application claims the benefit of United States provisional application No. 60/014,560, filed Apr. 3, 1996.

BACKGROUND OF THE INVENTION

This invention relates to programmable logic devices, and more particularly to improved programmable logic elements for use in programmable logic devices.

Programmable logic devices contain programmable circuitry that can be customized by a user to provide a desired logic function. Such devices are popular, in part because they allow a user to implement a circuit design much more quickly than is possible by fabricating a custom integrated circuit.

At their most basic level, all programmable logic devices contain some sort of programmable logic element. Because the operation of a programmable logic device is governed by the states of its individual logic elements, the user can configure the circuitry of a programmable logic device by programming the programmable logic elements. The way in which the programmable logic elements are programmed depends on the type of programmable logic element that is used. For example, if the programmable logic elements within a programmable logic device are fuses made of short metal links, then the programmable logic device is programmed by selectively blowing certain fuses.

Other suitable programmable logic elements include those based on anti-fuses, static random access memory (SRAM) transistor elements, dynamic random access memory (DRAM), erasable programmable read-only memory (EPROM) transistors, FLASH transistors, and electrically-erasable programmable read-only memory (EEPROM) transistors.

Anti-fuse-based devices work similarly to fuses, except that anti-fuses are programmed by applying voltages which, when exceeded, convert an initially open circuit to a permanently closed one. Both fuses and anti-fuses can only be programmed once. If it is desired to alter the configuration of a programmable logic device based on fuses or anti-fuses that has been programmed, the device must be discarded.

SRAM-based devices store bits of programming data in an array of bi-stable logic elements (e.g., flip-flops). Each bit is written once and remains until the bit is rewritten or until the power to the device is turned off. Because the stored program is volatile, provisions must be made for programming such devices in the field, which is not always desirable.

DRAM-based devices store bits on charged capacitors. Data stored in a DRAM-based device typically cannot be retained for more than a brief interval unless the DRAM elements are refreshed. Thus, DRAM-based devices are volatile like SRAM-based devices.

Programmable logic elements based on EPROM transistors are non-volatile. EPROM transistors have floating gates which may be charged by connecting a programming voltage ($V_{pp}$) of approximately 10–15 volts on the control gate and 6–8 volts between the source and the drain. The high fields caused by the large drain and control gate voltages create hot electrons in the conducting channel of the EPROM transistor. Some of the hot electrons flow onto the floating gate, thereby charging the floating gate and raising the transistor's threshold voltage. Because the state of an EPROM transistor's floating gate (i.e., charged or not charged) affects the transistor's threshold state, the state of the transistor may be determined from the switching behavior of the device.

Generally, when the threshold voltage of a transistor is greater than the normal operating voltage $V_{cc}$, a MOSFET channel will not form and the transistor will not conduct between its drain and source. (A normal operating voltage, $V_{cc}$, as used herein, refers to any voltage between about 1.0 volts and about 7.0 volts, and typically about 3.3 volts.) A programmable logic element formed from an EPROM transistor in a high threshold state is sometimes referred to as being "off," or "open." In the off state, it is desirable that the threshold voltage be raised as high as possible above $V_{cc}$ to provide a guard band effect in the event that variations in the applied voltage or threshold voltage degradation are experienced during normal operation. For an n-type MOSFET if the threshold voltage is less than or equal to zero volts, a conductive channel is formed between the drain and the source, even with no gate bias. An EPROM-based programmable logic element having a transistor in a low threshold state is often referred to as being "on," or "closed." In the on state, it is desirable that the threshold voltage be low enough to substantially eliminate any signal degradation (i.e., voltage drop across the transistor) during operation.

EEPROM-based programmable logic devices are non-volatile and have floating gates. They can be selectively reprogrammed by applying electrical pulses across a very thin tunneling dielectric (typically from about 70 Å to about 100 Å) to individual EEPROM programmable logic elements. One variety of EEPROM, called FLASH EEPROM, is also capable of being fabricated at a high density. However, EEPROM transistors fabricated using a relatively simple "single level polysilicon" process occupy a relatively large surface area on a programmable logic device (about twenty-five square microns) in comparison with non-volatile elements such as anti-fuses, which typically occupy only a few square microns. EEPROM transistors that occupy a few square microns of surface area are available, but only by using a more complex "double level polysilicon" process.

The floating gates in such transistor-based devices must be charged and discharged. Charging can be accomplished in two ways. The first way in which a floating gate may be charged is by a quantum-mechanical process called Fowler-Nordheim tunneling. With this mechanism, electrons tunnel through the insulating layer that separates the floating gate from the electrode upon application of a high electric field across the insulating layer. The second way in which a gate can be charged is by a process known as hot electron charging. In this process, a hot electron current is formed between the source and drain of the transistor. Either Fowler-Nordheim tunneling or ultraviolet radiation can be used to discharge the floating gate of a floating gate transistor.

Programmable logic devices usually contain arrays of programmable logic elements, which are interconnected with orthogonal groups of bit lines and word lines. Bit lines and word lines are connected at their intersections by programmable logic elements. The programmable logic device can be programed to achieve a desired logic configuration by individually addressing the programmable logic elements using the bit lines and word lines. For example, the desired programming data for each programmable logic element can be provided by applying a predetermined programming voltage to selected word and bit lines. Devices are commonly programmed by sequentially programming each programmable logic element during a pass through the array.

It would therefore be desirable to provide a non-volatile programmable logic element that has two terminals that is electrically reprogrammable.

It would be further desirable to provide a programmable logic element that occupies less surface area and is simpler to fabricate than EEPROM transistor programmable logic elements.

It would be even more desirable to provide a programmable logic element that can be used as an anti-fuse element.

SUMMARY OF THE INVENTION

It is therefore an object of this invention to provide a non-volatile programmable logic element that has two terminals and is electrically reprogrammable.

It is also object of this invention to provide a programmable logic element that occupies less surface area.

It is another object of this invention to provide a programmable logic element that can be used as an anti-fuse element.

In accordance with the present invention, a two terminal programmable logic element and associated methods for charging and discharging the logic element is provided. The two terminal programmable logic element comprises an input terminal, an output terminal, a first capacitor region, a second tunneling capacitor region, and a floating gate (or transistor-type) structure. Both capacitors have first and second electrodes. The floating gate structure has (1) a source which is connected to the input terminal and to the first electrode of the first capacitor region, (2) a drain which is connected to the output terminal and the second electrode of the second tunneling capacitor region, and (3) a floating gate which is connected to the second electrode of the first capacitor region and the first electrode of the second capacitor region.

Charging and discharging the two-terminal electrically-reprogrammable programmable logic element may be accomplished by connecting the input or output terminal of the logic element to a programming voltage, $V_{pp}$, significantly greater than the normal operating voltage, $V_{cc}$. For instance, to charge a programmable logic element described by this invention, the voltage at the input terminal is raised and the output terminal is grounded, which allows the floating gate to charge via Fowler-Nordheim tunneling. To discharge a programmable logic element described by this invention, the voltage at the output terminal is raised and the input terminal is grounded, which allows the floating gate to discharge via Fowler-Nordheim tunneling.

BRIEF DESCRIPTION OF THE DRAWINGS

The above and other objects and advantages of the invention will be apparent upon consideration of the following detailed description, taken in conjunction with the accompanying drawings in which like reference characters refer to like parts throughout, and in which.

DETAILED DESCRIPTION OF THE PREFERRED EMBODIMENTS

Figure 1:
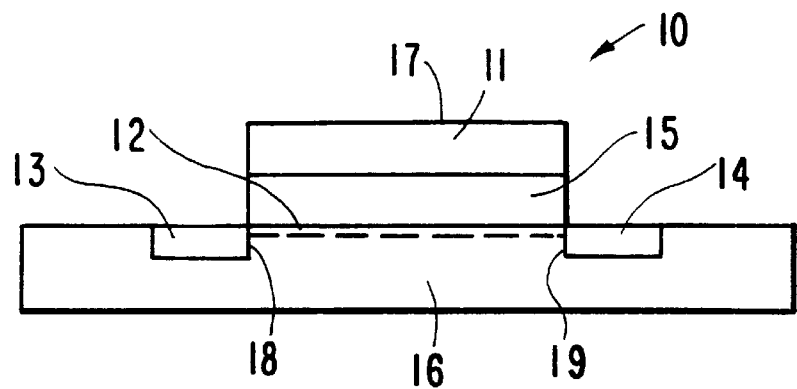
FIG. 1 is a cross-sectional view of an EPROM transistor used as a programmable logic element in a conventional programmable logic device.

As shown in FIG. 1, conventional floating gate metal-oxide semiconductor field-effect transistor 10 has floating gate 11 which modulates the conductance of electrically conductive channel 12 between source 13 and drain 14. Floating gate 11 is electrically insulated from channel 12 by oxide layer 15. In the case of an n-channel enhancement mode MOSFET, substrate 16 is p-type silicon. (Transistor 10 is normally off because substrate 16 forms p-n junctions 18 and 19 with source 13 and drain 14, respectively.) If the voltage of floating gate 11 is made sufficiently attractive, minority carriers (e.g., electrons in the case of an n-channel MOSFET) will be drawn from substrate 16 to form conductive channel 12 between source 13 and drain 14, turning on MOSFET 10. Floating gate 11 is made sufficiently attractive by applying a large positive programming voltage to remove electrons from gate 11. A programming voltage, as used herein, refers to any voltage having a magnitude sufficient to charge or discharge the floating gate of a transistor structure, or MOSFET. Preferably, programming voltage, $V_{pp}$, is between about 8 and about 20 volts, and most preferably about 15 volts. The removal of electrons from floating gate 11 occurs across a tunneling oxide, which may be gate oxide 15 in the case of a Flash EPROM transistor or a separate element in the case of an EEPROM transistor. As floating gate 11 becomes positively charged through the removal of its electrons, more minority carriers are drawn from source 13 and drain 14 into channel 12, increasing the conductivity between these points.

Figure 2:
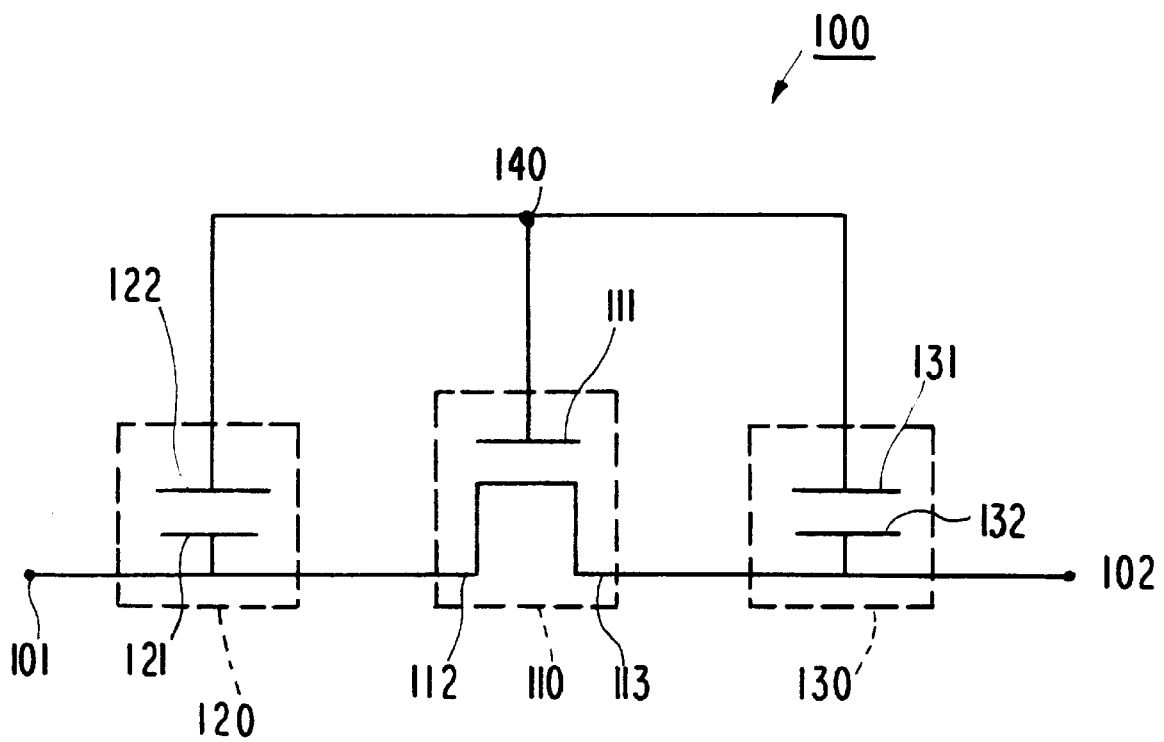
FIG. 2 is a schematic representation of the programmable logic element of the present invention.

A schematic diagram of a programmable logic element 100 in accordance with the present invention is shown in FIG. 2. Programmable logic element 100 may be electrically programmed to connect terminal 101 to terminal 102. If desired, programmable logic element 100 may also be electrically reprogrammed. Programmable logic element 100 includes MOSFET structure 110 in parallel with capacitor region 120 and capacitor region 130. Capacitor region 120 has electrodes 121 and 122. Capacitor region 130 has electrodes 131 and 132 between which lies a tunneling dielectric. The gate node 140 is electrically isolated.

The threshold voltage of MOSFET structure 110 of programmable logic element 100 is determined by the amount of charge deposited on floating gate 111. Capacitor region 120 is a conventional capacitor region that does not permit electron flow between electrode 121 and electrode 122. However, when the appropriate programming voltage, $V_{pp}$, is applied across terminals 101 and 102, a tunneling current between electrodes 131 and 132 charges or discharges floating gate 111.

The capacitances of capacitor regions 110, 120, and 130 are ratioed in a predetermined way. The capacitance ratio between capacitor regions 110 and the sum of the capacitance of regions 120 and 130 should be between about 8:1 and about 20:1, and preferably about 10:1. This preferred arrangement allows programmable logic element 100 to be charged or discharged by applying the appropriate voltages to terminals 101 and 102. Programmable logic element 100 may be based on either an n-channel MOSFET (NFET) or a p-(channel MOSFET (PFET) structure. In an NFET-based structure, charging floating gate 111 raises the threshold voltage of MOSFET 110 to a high state (above $V_{cc}$). Discharging floating gate 111 lowers the threshold voltage to a low state (typically near or below ground).

A relatively high threshold state may be obtained by applying a relatively high programming voltage, $V_{pp}$, to input terminal 101 while holding the output terminal 102 near ground. Because capacitor regions 120 and 130 are in series, the relative voltage drop across each capacitor region is inversely proportional to its capacitance (the capacitance of capacitor region 110 is normally insignificant). Capacitor regions 120 and 130 therefore operate as a voltage divider so that the initial voltage at node 140 is intermediate of that at terminals 101 and 102. For example, if input terminal 101 is connected to a programming voltage, $V_{pp}$, of 15 volts and the capacitance ratio is 10:1 the initial voltage drop across capacitor region 130 is approximately ten-elevenths of programming voltage $V_{pp}$ (or about volts +13.6 volts). The initial voltage drop across capacitor region 120 is approximately one-eleventh of programming voltage $V_{pp}$ (or about +1.4 volts). Because floating gate 111 is connected to electrodes 122 and 131, the voltage at floating gate 111 is also about +13.6 volts relative to ground.

The voltage divider formed by capacitor regions 120 and 130 also protects programmable logic element 100 from stray voltages that may inadvertently be applied to output terminal 102, because the 10:1 capacitance ratio makes signals applied to output terminal 102 ten times weaker than signals applied through input terminal 101.

The relatively high potential of floating gate 111 that results when programming voltage $V_{pp}$ is applied to terminal 101 causes electrons to be pulled onto floating gate 111 through tunneling capacitor region 130 until floating gate 111 is fully charged. After floating gate 111 is charged, programming voltage $V_{pp}$ is disconnected from input terminal 101 and the ground is disconnected from output terminal 102. Preferably, the charge on floating gate 111 raises the threshold voltage of MOSFET structure 110 above $V_{cc}$. Charged floating gate 111 will remain charged until a voltage equivalent in magnitude to programming voltage, $V_{pp}$, but with the opposite polarity across terminals 101 and 102, is applied. Because the raised threshold voltage is larger than the conventional operating voltage, $V_{cc}$, when MOSFET structure 110 is programmed into the high threshold state, MOSFET structure 110 will be off and will not turn on even if a logical high signal (i.e., $V_{cc}$) is applied to input terminal 101. Thus, when MOSFET structure 110 is programmed to a high threshold state by charging floating gate 111, programmable logic element 100 will not pass signals received at input terminals 101 to output terminal 102.

However, when the threshold voltage of MOSFET structure 110 is reduced by discharging floating gate 111, programmable logic element 100 will pass the signals applied to input terminal 101 to output terminal 102. The threshold voltage of MOSFET structure 110 may be reduced by grounding input 101 and connecting output 102 to programming voltage $V_{pp}$. In this configuration, electrons on floating gate 111 are attracted to drain 113. Electrons flow from floating gate 111 to drain 113 through tunneling capacitor region 130 via Fowler-Nordheim tunneling until floating gate 111 is fully discharged. Discharging floating gate 111 lowers the threshold voltage of MOSFET structure 110.

Figure 3:
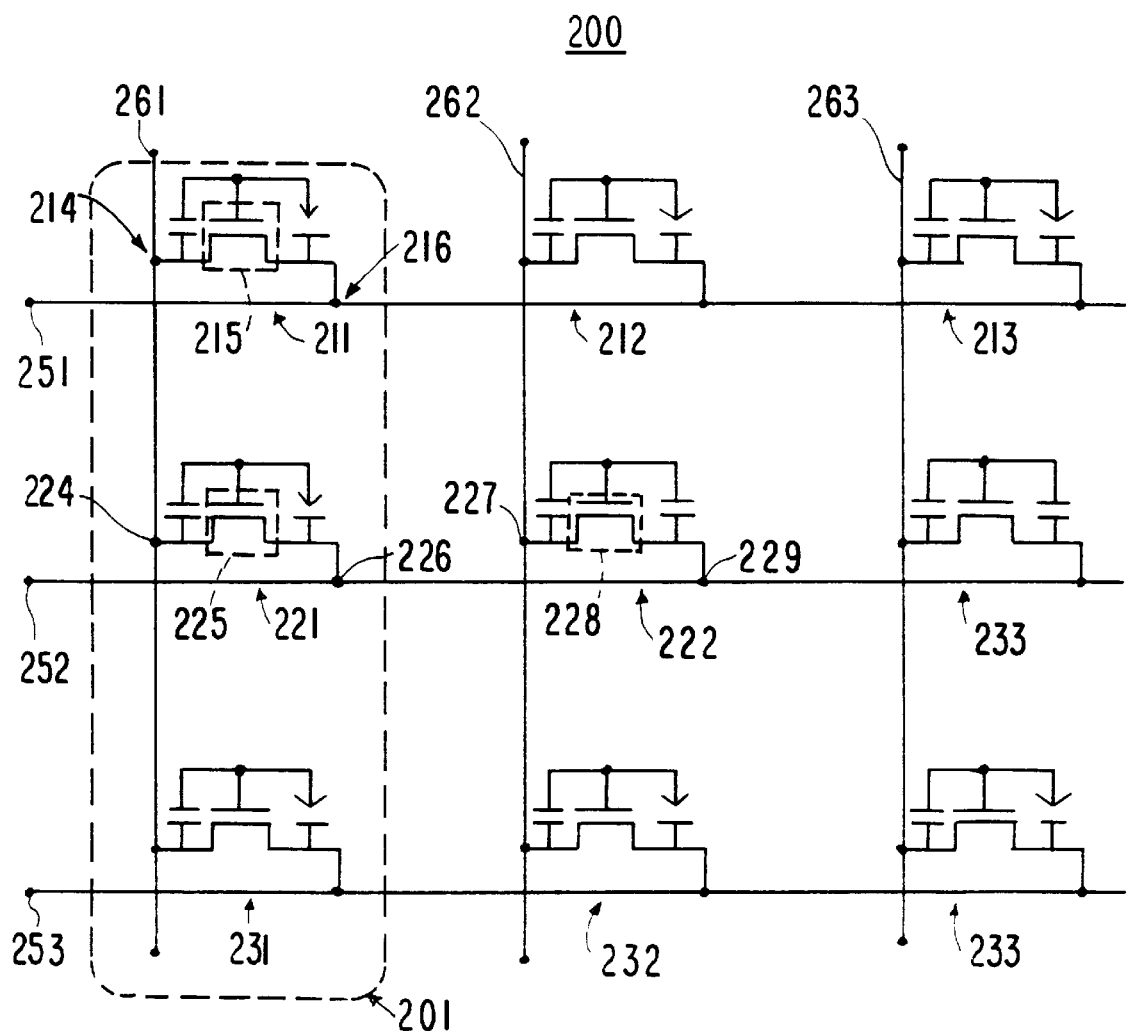
FIG. 3 is a schematic representation of an illustrative programmable logic device constructed using the programmable logic elements of FIG. 2.

Programmable logic elements 100 may be used in a variety of programmable logic devices. For example, as shown in FIG. 3, a plurality of two terminal programmable logic elements (211, 212, 213, 221, 222, 223, 231, 232, and 233) can be used to construct programmable logic array 200. Bit lines (261–263) of logic array 200 are connected to word lines (251–253) by programmable logic elements (211, 212, 213, 221, 222, 223, 231, 232, and 233). Each programmable logic element in device 200 has an input terminal and an output terminal. For example, programmable logic element 211 has input terminal 214 and output terminal 216. Each programmable logic element input terminal is connected to one bit line and each programmable logic element output terminal is connected to one word line. For example, input terminal 214 of programmable logic element 211 is connected to bit line 261 and output terminal 216 of programmable logic element 211 is connected to word line 251.

Each programmable logic element (211, 212, 213, 221, 222, 223, 231, 232, and 233) in logic array 200 may be charged individually. For example, programmable logic element 211 may be charged by connecting word line 251 to ground at output terminal 216 and bit line 261 to programming voltage $V_{pp}$. In this way, programming voltage, $V_{pp}$, is applied to input terminal 214 and ground is applied to output terminal 216, causing the charge to flow onto the floating gate of MOSFET structure 215. Further, blocks of programmable logic elements whose inputs are all connected to the same bit line may be charged simultaneously. For example, block 201, which includes programmable logic elements 211, 221, and 231, connected to bit line 261, may be programmed by connecting word lines 251–253 connected to block 201 to ground. Bit lines 261–263 are also connected to ground. Next, bit line 261 is disconnected from ground and connected to programming voltage $V_{pp}$. In this configuration, the threshold voltage of programmable logic elements 211, 221, and 231 are increased as charge is transferred to the floating gates of programmable logic elements (211, 221, and 231). Programming voltage $V_{pp}$ and ground are then disconnected from logic array 200. At this stage, programmable logic elements 211, 221, and 231 in block 201 are each charged (i.e., programmed to a high threshold state). Each vertical block in device 200 can be programmed in the same way.

In accordance with the present invention, the floating gate of the programmable logic element is preferably charged via Fowler-Nordheim tunneling. An alternative approach for charging the floating gate is to use hot electron injection. However, special processing and device design techniques may be required in this case because of the lack of independent control of the gate and drain voltages.

In order for programmable logic device 110 (FIG. 2) to be electrically reprogrammable, the floating gates of individual programmable logic elements must be capable of being discharged. To lower the threshold of an isolated programmable logic element (not part of a logic device), its output terminal is connected to programming voltage $V_{pp}$ and its input terminal is connected to a voltage near ground. If it is desired to discharge a programmable logic element contained within a programmable logic array, these connections are still made to the logic element being discharged, however, voltages intermediate between 0 and $V_{pp}$ are also simultaneously connected to all other bit and word lines in the device to prevent disturbance of other bits.

For example, if it is desired to lower the threshold of logic element 221 of programmable logic array 200 shown in FIG. 2, but not change other elements' thresholds, bit lines 262 and 263 and word lines 251 and 253 are connected to voltages having a magnitude intermediate between 0 and $V_{pp}$ (e.g., about $V_{pp}/2$). Word line 252 is connected to programming voltage $V_{pp}$ and bit line 261 is connected to a voltage near ground. After forming these connections, the voltage drop across programmable logic element 221 is equal to programming voltage $V_{pp}$. If the capacitance ratio is 10:1, the voltage drop across MOSFET structure 225 in programmable logic element 221 is then ten-elevenths of $V_{pp}$. This voltage is sufficiently large to induce the floating gate of element 221 to discharge through the tunneling capacitor region via Fowler-Nordheim tunneling. Intermediate voltages placed on bit lines 262 and 263 and word lines 251 and 253 are properly chosen, the threshold states of the remaining logic elements in the device remain unchanged because the voltage drop across those remaining elements would be insufficient to cause tunneling. After programming, word lines 251–253 and bit lines 261–263 are returned to ground. This process selectively discharges programmable logic element 221 thereby reducing its threshold voltage and making it responsive to input signals.

The states of the remaining logic elements in programmable logic array 200 (all those except logic element 221) are not changed during the process of charging or discharging programmable logic element 221 because the voltage drop across these elements is insufficient to induce Fowler-Nordheim tunneling in the tunneling capacitor regions of these elements. In the absence of discharge by tunneling currents, the gates remain either charged or uncharged so that the corresponding states of the logic elements remain unchanged.

To charge the floating gate and thereby raise the threshold voltage of an individual programmable logic element, a method analogous to the discharging procedure may be used. For example, to charge the floating gate of programmable logic element 222, bit lines 261 and 263 and word lines 251 and 253 are raised to voltages having magnitudes intermediate between 0 volts and $V_{pp}$ (i.e., $V_{pp}/2$). To raise the voltage threshold of programmable logic element 222, word line 252 is connected to ground and bit line 262 is connected to programming voltage $V_{pp}$. After these connections are made, only programmable logic element 222 has a voltage drop equal to $V_{pp}$ between input terminal 227 and output terminal 229. The voltage drop across MOSFET structure 228 is then ten-elevenths of $V_{pp}$, which creates an electric field sufficiently large to induce Fowler-Nordheim tunneling across the tunneling capacitor region portion of programmable logic element 222, thereby charging the floating gate. The states of the remaining logic elements in device 200 remain unchanged because no other programmable logic elements are exposed to a sufficiently large voltage to induce tunneling.

Figure 4:
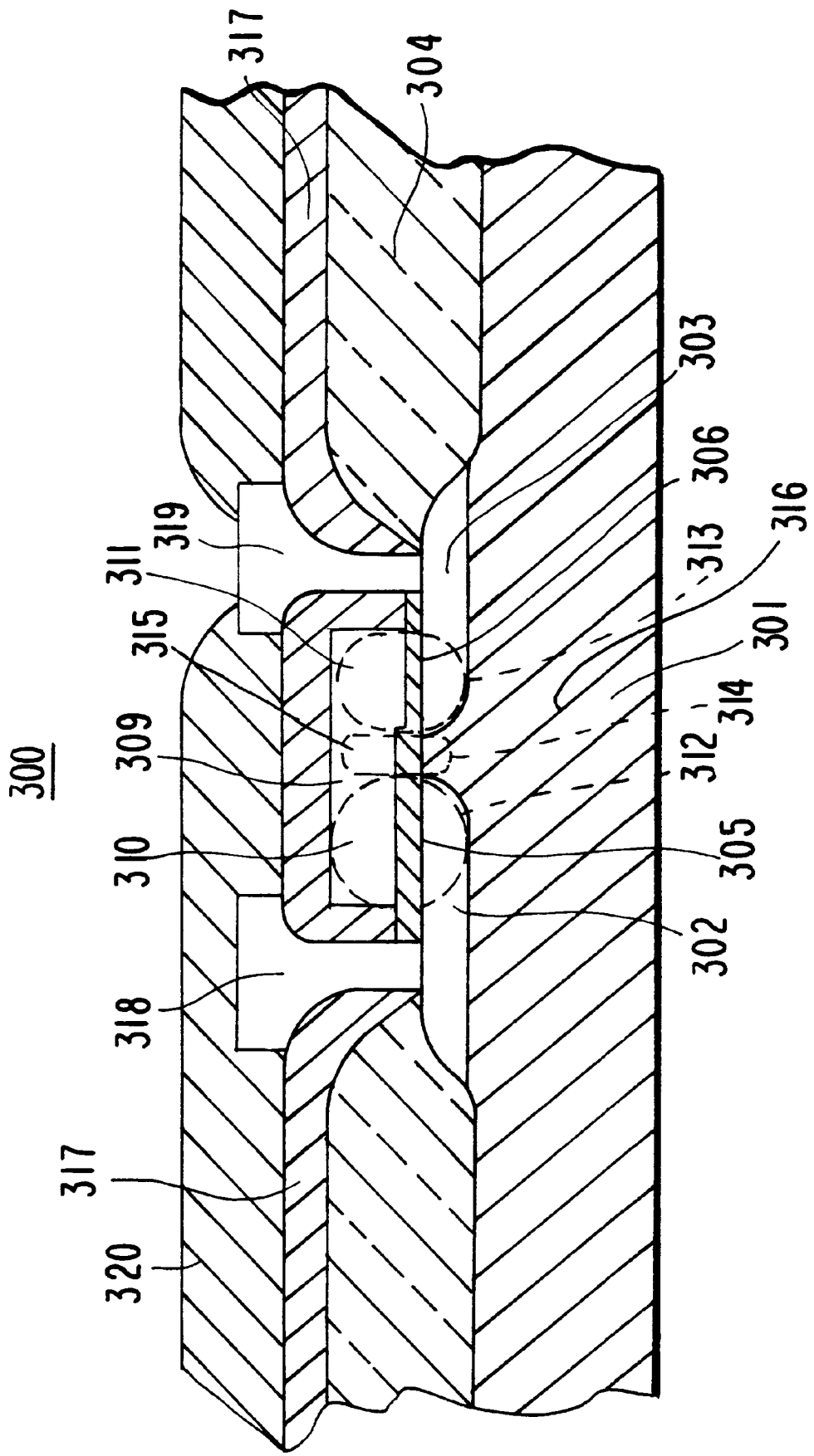
FIG. 4 is a cross-sectional view of a first illustrative embodiment of the programmable logic element of FIG. 2.

A cross-sectional view of a first illustrative programmable logic element 300 is shown in FIG. 4. Buried electrically conductive electrodes 302 and 303 are formed on substrate 301. Field oxide layer 304 is disposed adjacent to buried electrodes 302 and 303 and above remaining portions of substrate 301. Gate oxide layers 305 and 306 are disposed above buried electrodes 302 and 303. Gate oxide layer 305, which lies directly above electrode 302, may be between about 80 Å and about 1000 Å thick and preferably about 150 Å thick. Gate oxide layer 306 disposed directly above electrode 303 may be between about 40 Å and about 500 Å and preferably about 75 Å thick. It should be understood that gate oxide layers 305 and 306, as well as field oxide layer 304, could be any insulating dielectric material and not necessarily an oxide layer.

Polysilicon layer 309 is disposed on gate oxide layers 305 and 306, and above and between buried electrodes 302 and 303. Portion 310 of polysilicon layer 309 overlaps electrode 302 and has a substantially larger area than portion 311 of polysilicon layer 309, which overlaps electrode 303. Portion 310 of polysilicon layer 309 and buried electrode 302 form the two electrodes of capacitor region 312 (corresponding to capacitor region 120 in FIG. 2). Overlapping portion 311 of polysilicon layer 309 and buried electrode 303 form the two electrodes of capacitor region 313 (corresponding to capacitor region 130 in FIG. 2).

The capacitance ratio between capacitor region 312 and capacitor regions 313 and 314 should be between about 8:1 and about 20:1, and preferably about 10:1. It is well known that the capacitance of a capacitor is proportional to the electrode area and inversely proportional to the thickness between the capacitor electrodes. The area of capacitor region 312 should be between about 1 square micron and about 90 square microns, and preferably about 7 square microns. Preferably, the area of capacitor region 312 should be about thirty times larger than the area of capacitor region 313. Therefore, the area of capacitor region 313 should be between about 0.03 square microns and about 3 square microns, and preferably about 0.25 square microns. The thickness of gate oxide layer 305 of capacitor region 312 should be about 1.5 to about 3 times, and preferably about 2 times, thicker than the thickness of gate oxide layer 306. These relative thicknesses ensure that a tunneling current can flow across gate oxide layer 306 of capacitor region 313, but not across gate oxide layer 305 of capacitor region 312 and establish the desired capacitance ratio between capacitor regions 312 and 313.

In addition to forming upper electrodes for capacitor regions 312 and 313, polysilicon layer 309 forms the floating gate of floating gate structure 314. In particular, portion 315 of polysilicon layer 309 between electrodes 302, 303 operates as a floating gate in MOSFET structure 314. Electrode 302 operates as a source and electrode 303 operates as a drain for the MOSFET structure portion of programmable logic element 300. When the appropriate voltage is applied to floating gate 315, an electric field is produced in substrate 301 that attracts carriers to form conductive channel 316 between electrodes 302 and 303. Floating gate 315 of programmable logic element 300 can be charged and discharged about 1,000,000 times.

The additional insulating layers shown in FIG. 4 electrically isolate the active components of programmable logic element 300. Isolation layer 317, preferably a borophosphate, is disposed above electrodes 302 and 303. Insulating field oxide layer 304 electrically isolates polysilicon layer 309 from electrical contacts 318 and 319. Electrical contacts 318 and 319 extend through layers 317 and 304 and are connected to buried electrodes 302 and 303. Isolation layer 320, which is disposed on isolation oxide layer 317, electrically insulates electrical contacts 318 and 319 from each other and allows a second level of metallization (not shown) to be added to the device. Isolation layers 317 and 320 could be any insulating dielectric material and not necessarily an oxide layer.

Figure 5:
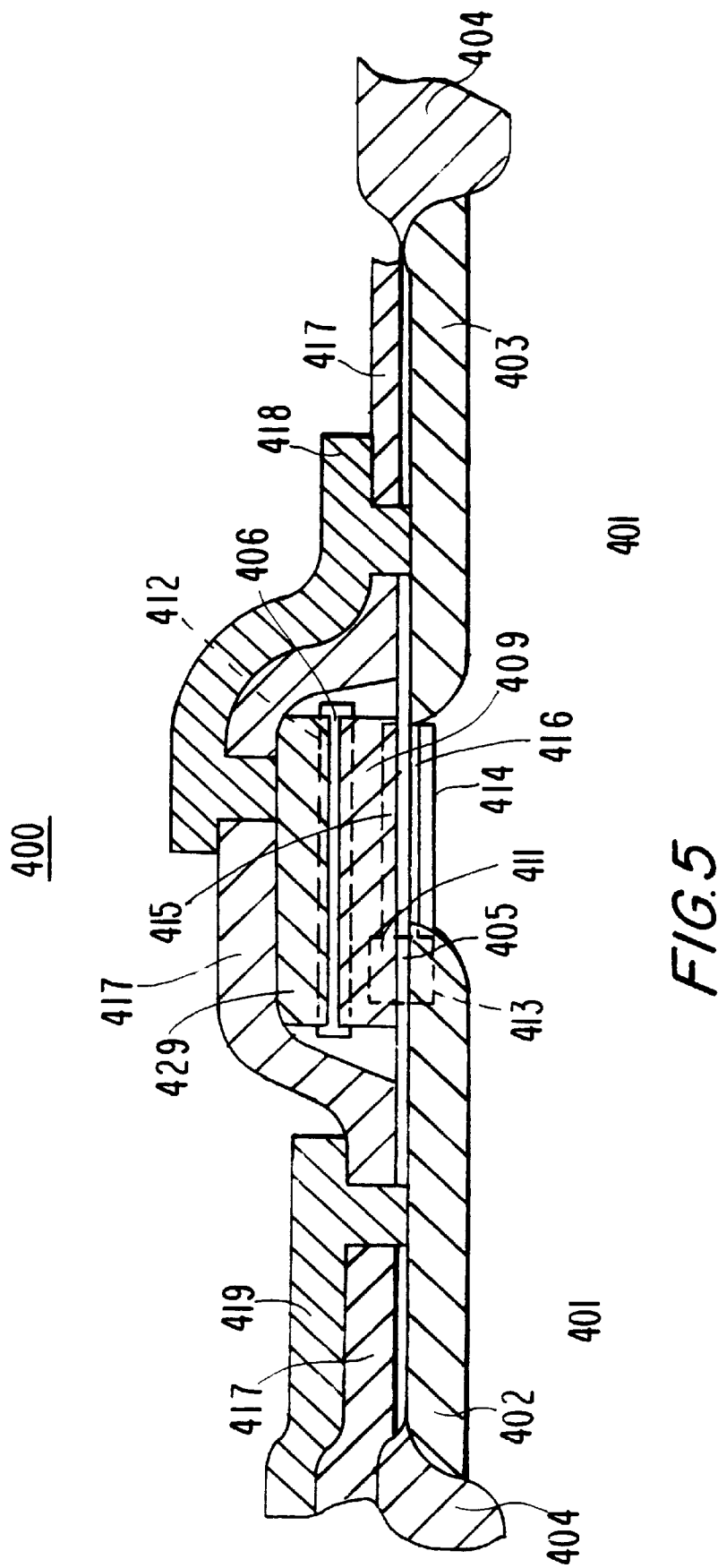
FIG. 5 is a cross-sectional view of a second illustrative embodiment of the programmable logic element of FIG. 2.

A cross-sectional view of a second illustrative programmable logic element 400 is shown in FIG. 5. As will be discussed more fully below, the principle difference between logic elements 300 and 400 is that logic element 300 includes two capacitor regions, each of which are formed between the polysilicon layer and one of the buried electrodes. Programmable logic element 400, however, only has one capacitor region formed between the polysilicon layer and a buried electrode. The second capacitor region of programmable logic element 400 is formed between polysilicon layers 409 and 429.

In particular, programmable logic element 400 includes two electrically conductive electrodes 402 and 403, which are formed on substrate 401. Electrical contacts 418 and 419 extend through layers 417 and 404 and are connected to buried electrodes 402 and 403. Electrical contact 418 is also connected to polysilicon layer 429. Field oxide layer 404 is disposed adjacent electrodes 402 and 403 and remaining portions of substrate 401. Gate oxide layer 405 is disposed above buried electrode 402. Gate oxide layer 405, which lies directly above a portion of electrode 402, should have a thickness between about 40 Å and about 500 Å, and preferably about 100 Å. Interpoly oxide layer 406 is disposed directly above polysilicon layer 409 and below polysilicon layer 429. The thickness of interpoly oxide layer 406 should be between about 80 Å and 1,000 Å, and preferably about 180 Å.

Polysilicon layers 409 and 429 form the electrodes of capacitor region 412 (corresponding to capacitor region 120 in FIG. 2). Overlapping portion 411 of polysilicon layer 409 and buried electrode 402 form two electrodes of capacitor region 413 (corresponding to capacitor region 130 in FIG. 2).

The capacitance ratio between capacitor region 412 and capacitor region 413 should be between about 8:1 and about 20:1, and preferably about 10:1. The area of the capacitor region 412 should be between about 1 square micron and about 80 square microns. Preferably, the area of capacitor region 412 should be about twenty times larger than the area of capacitor region 413. Therefore, the area of capacitor region 413 should be between about 0.05 square microns and about 4.0 square microns, and preferably about 0.25 square microns. It should be understood that the capacitance ratio in programmable logic element 400 can be made larger in logic element 400 than logic element 300 because capacitor region 412 can take advantage of the total area of polysilicon layer 409. The relative thicknesses of dielectrics 406 and 405 ensure that a tunneling current can flow across gate oxide layer 405 of capacitor region 413, but not across interpoly oxide layer 406 of capacitor region 412 and establish the desired capacitance ratio between capacitor regions 412 and 413.

In addition to forming an upper electrode of capacitor region 413 and a lower electrode for capacitor region 412, polysilicon layer 409 forms the floating gate of floating gate structure 414. In particular, portion 415 of polysilicon layer 409 operates as a floating gate in MOSFET structure 414. Electrode 402 operates as a source and electrode 403 operates as a drain for the MOSFET structure portion of programmable logic element 400. Therefore, when the appropriate voltage is applied to floating gate 415, an electric field is produced in substrate 401 that attracts carriers to form conductive channel 416 between electrodes 402 and 403. The additional layers shown in FIG. 5 electrically isolate the active components of programmable logic element 400 in a similar fashion to those shown in programmable logic element 300 in FIG. 4.

Another embodiment, in accordance with the principles of this invention, could fabricated with both capacitor regions formed above the floating gate. As shown in FIG. 4, programmable logic element 300 has two buried electrodes 302 and 303 which form capacitor regions 312 and 313, respectively, below polysilicon layer 309. Programmable logic element 400, on the other hand, only has one capacitor region 413 formed below polysilicon layer 409. The second capacitor region is formed above polysilicon layer 409 between polysilicon layers 409 and 429. Yet another embodiment could be fabricated with both capacitor regions formed above polysilicon layer 409 in a fashion similar to capacitor region 412 of logic element 400, for example. The surface area of such a programmable logic element could therefore be reduced because the contacts for the input and output terminals of the logic element are formed above the polysilicon layer, not beside it.

It will be understood that the foregoing are merely illustrative of the principles of this invention, and that various modifications can be made by those skilled in the art without departing from the scope and spirit of the invention. For example, gate oxide layers 306 and 406 of programmable logic elements 300 and 400 respectively, can be integrated into the edge portion of the drain resulting in an "edge-erase" tunneling node commonly used in FLASH EEPROM technology.

The described embodiments are presented for the purpose of illustration and not of limitation, and the present invention is limited only by the claims which follow.

The invention claimed is:

1. A two-terminal programmable logic element having no more than two terminals including an input terminal and an output terminal, said element comprising:
   a first capacitor region having a first electrode and a second electrode;
   a tunneling second capacitor region having a first electrode and a second electrode; and
   a floating gate structure comprising:
      a source connected to the input terminal that forms said first electrode of said first capacitor region,
      a drain connected to said output terminal and that forms said second electrode of said second capacitor region, and
      a floating gate that is charged and discharged via Fowler-Nordheim tunneling and that is connected to said second electrode of said first capacitor region and said first electrode of said second capacitor region, said floating gate having a third capacitance.

2. The programmable logic element of claim 1 wherein said floating gate structure is a metal-oxide semiconductor field effect transistor structure.

3. The programmable logic element of claim 1 wherein said first capacitor region has a first capacitance that is larger than a sum of said second capacitance and said third capacitance, which are associated with said second capacitor and said floating gate, respectively.

4. The programmable logic element of claim 3 wherein said first capacitance is between about 8 times and about 20 times greater than said sum.

5. The programmable logic element of claim 3 wherein said first capacitance is about 10 times greater than said sum.

6. The programmable logic element of claim 1 wherein said first capacitor region has an area from between about 1 square micron to about 90 square microns.

7. The programmable logic element of claim 1 further comprising a dielectric material located between said first and second electrodes of said first capacitor region.

8. The programmable logic element of claim 7 wherein said dielectric material has a thickness between about 80 Å and about 1000 Å.

9. The programmable logic element of claim 7 wherein said dielectric material comprises an oxide.

10. The programmable logic element of claim 1 wherein said second capacitor region has an area between about 0.03 square microns and about 3.0 square microns.

11. The programmable logic element of claim 1 further comprising a dielectric material located between said first and second electrodes of said second capacitor region.

12. The programmable logic element of claim 11 wherein said dielectric material has a thickness between about 40 Å and about 500 Å.

13. The programmable logic element of claim 11 wherein said dielectric material comprises an oxide.

14. The programmable logic element of claim 1 wherein said second electrode of said first capacitor region, said first electrode of said second tunneling capacitor, and said gate are an integral structure.

15. The programmable logic element of claim 14 wherein said integral structure comprises polysilicon.

16. The programmable logic element of claim 1 wherein said first electrode of said first capacitor region and said second electrode of said second tunneling capacitor region are electrically conductive.

17. The programmable logic element of claim 16 wherein said first electrode of said first capacitor region and said second electrode of said second tunneling capacitor region comprise metal.

18. A two-terminal integrated circuit programmable logic element having first and second terminals, comprising:
   a floating gate structure connected between said first and second terminals and having a floating gate, the floating gate having a first charge state which prevents electrical signals from passing between said first and second terminals and a second charge state that allows signals to pass between said first and second terminals;
   a tunneling structure connected to said floating gate for charging and discharging said floating gate; and
   a voltage divider connected between said first and second terminals and connected to said tunneling structure for dividing programming voltages supplied across said first and second terminals to produce an intermediate voltage that is applied to said tunneling structure; wherein:
      when said programming voltage is at a first voltage level, the resulting intermediate voltage causes said gate to be in said first charge state; and
      when said programming voltage is at a second voltage level, the resulting intermediate voltage causes said gate to be in said second charge state.

19. A two-terminal apparatus having no more than two terminals including a first terminal and a second terminal, said apparatus comprising:
   a capacitor region having a first electrode and a second electrode, said first electrode of said capacitor region being coupled to the first terminal;
   a tunnel region having a first electrode and a second electrode, said second electrode of said tunnel region being coupled to the second terminal;
   a transistor region having a first transistor electrode that forms said first electrode of said capacitor region, said first electrode being coupled to the first terminal and a second transistor electrode that forms said second electrode of said tunnel region, said second electrode being coupled to the second terminal; and
   a floating gate structure in common with the capacitor region, the tunnel region, and the transistor region, wherein said floating gate structure is charged and discharged via Fowler-Nordheim tunneling.

20. The apparatus of claim 19, wherein said capacitor region has a capacitance greater than a capacitance of said tunnel region.

21. The apparatus of claim 19, wherein the capacitor region has a first capacitance that is larger than a sum of a second capacitance and a third capacitance, which are associated with said tunnel region and said floating gate structure, respectively.

22. The programmable logic element of claim 21 wherein said first capacitance is between about 8 times and about 20 times greater than said sum.

23. The apparatus of claim 19, further comprising an oxide layer in the capacitor region and the tunnel region.

24. The apparatus of claim 23, wherein the oxide layer in the capacitor region is thicker relative to the oxide layer in the tunnel region.

25. The apparatus of claim 19 wherein said first electrode of said capacitor region, said second electrode of said tunnel region, and said floating gate structure form an integral structure.

26. The apparatus of claim 25 wherein said integral structure comprises polysilicon.

27. The apparatus of claim 19 wherein said first electrode of said capacitor region and said second electrode of said tunnel region are electrically conductive.

28. The apparatus of claim 27 wherein said first electrode of said capacitor region and said second electrode of said tunnel region comprise metal.

* * * * *